United States Patent [19]

Strucker

[11] 4,030,031
[45] June 14, 1977

[54] MAGNETIC DAMPING SYSTEM FOR INDUCTION WATTHOUR METERS

[75] Inventor: Harold Lloyd Stucker, Somersworth, N.H.

[73] Assignee: General Electric Company, New York, N.Y.

[22] Filed: Sept. 10, 1975

[21] Appl. No.: 612,122

[52] U.S. Cl. .................. 324/152; 73/430; 324/125; 324/137

[51] Int. Cl.² .................. G01R 1/14; G01R 11/10

[58] Field of Search ........... 324/137, 152, 125; 310/103, 105; 73/430; 335/225

[56] References Cited

UNITED STATES PATENTS

| | | | |
|---|---|---|---|
| 1,945,523 | 2/1934 | Flehr | 324/152 |
| 2,196,898 | 4/1940 | Faus | 324/152 |
| 2,309,414 | 1/1943 | Nobbs | 324/152 X |
| 2,605,301 | 7/1952 | Barnes | 324/152 |
| 2,757,339 | 7/1956 | Road | 324/137 X |
| 2,831,165 | 4/1958 | Smith et al. | 324/152 |

FOREIGN PATENTS OR APPLICATIONS

| | | | |
|---|---|---|---|
| 727,260 | 2/1966 | Canada | 324/152 |
| 804,694 | 4/1951 | Germany | 324/152 |
| 247,751 | 12/1947 | Switzerland | 324/152 |

Primary Examiner—Gerard R. Strecker
Attorney, Agent, or Firm—R. G. Simkins; P. L. Schlamp; F. L. Neuhauser

[57] ABSTRACT

A new and improved magnetic damping system for induction watthour meters including electromagnetically driven disk armatures. The magnetic damping system comprises cobalt-rare earth permanent magnets of relatively small mass deployed in a counterposed pair of unit assemblages each of which is positioned on an opposite side of the driven disk.

10 Claims, 3 Drawing Figures

MAGNETIC DAMPING SYSTEM FOR INDUCTION WATTHOUR METERS

BACKGROUND OF THE INVENTION

Magnetic damping or drag means utilizing permanent or "hard" magnets have for some years been used with instruments containing rotatable electroconductive disk armature members driven by electromagnetic flux fields such as integrating watthour meters for measuring the rate of flow or utilization of electrical energy. Magnetic damping or drag means in such instruments, as is well known, dampen or retard, and govern the speed of rotation of the disk armature. The disk speed results from the force produced within the disk by interacting flux fields generated by induction magnets which are activated by the voltage and the current in the circuit being measured.

The prior art provides many examples of various types and systems of magnetic damping means for electromagnetically driven disk armatures in induction watthour meters, and details their mechanisms and operations. For example, U.S. Pat. Nos. 2,110,418, 2,595,244, 2,196,898, 2,668,275, 2,272,748, 2,683,921, 2,316,638, and many others. The contents of the foregoing cited U.S. patents are incorporated herein by reference.

SUMMARY OF THE INVENTION

This invention comprises a new and improved magnetic damping or drag device and system for induction type alternating current watthour meters utilizing permanent magnets of cobalt-rare earth compositions. The magnetic damping device and system of the invention comprises a counterposed pair of damping magnetic units, each containing an assemblage of a relatively small cobalt-rare earth permanent, or "hard", magnetic body combined with magnetic flux conducting, non-permanent, or "soft", members. Each assemblage of parts constitutes an integrated composite magnetic unit which, when matched or paired with a like unit in a counterposed relationship with unlike magnetic poles aligned opposite each other, forms a closed magnetic circuit with an air gap through which the disk armature may move. The magnetic flux in this circuit passes through the disk twice, once in each direction, to further improve the efficiency of permanent magnet material utilization. As the disk moves through the air gap, an opposing force to the direction of motion is developed within the disk by the electromagnetic interaction between the flux and the moving disk.

OBJECTS OF THE INVENTION

It is a primary object of this invention to provide a novel magnetic damping device and system for electromagnetic flux-driven disk armatures which utilize permanent magnets of relatively small mass composed of cobalt-rare earth compositions and having relatively high residual magnetism per unit volume of material and superior stability from external magnetic fields.

It is also an object of this invention to provide a novel magnetic damping device and system for electromagnetic flux-driven disk armatures in alternating current induction watthour meters which enable and provide for the reduction of the amount of magnetic material forming the permanent magnetic, and the size or mass of its body.

It is a further object of this invention to provide a novel magnetic damping device and system for electromagnetic flux-driven disk armatures in alternating current induction watthour meters which are resistant to electrical surges and shock, and which can be magnetized with a unidirectional field of a magnetizing electrical coil.

It is a still further object of this invention to provide a novel magnetic damping device for electromagnetic flux-driven disk armatures in alternating current induction watthour meters comprising a two pole system which provides substantially greater damping torque per unit volume of the permanent magnetic material or mass, and is suitable for use with a mechanical vernier control.

It is additionally an object of this invention to provide a novel and improved alternating current induction watthour meter with a rotatable electroconductive disk armature member driven by alternating fluxes produced by an alternating current electromagnetic and having a matched two pole magnetic damping device and system containing cobalt-rare earth permanent magnets of relatively small size and high residual magnetism which are stable under magnetic shock or electrical surges and produce a closed loop or circular field of high intensity magnetic flux which passes twice through the disk armature and in opposite directions for effecting the damping function.

It is also a further object of this invention to provide a novel magnetic damping device or system whereby the amount of retarding can be magnetically adjusted by applying a knockdown pulse when the system is installed in the meter and the disk armature is in place, and moreover which has minimal flux variation across the device air gap whereby the retarding torque does not vary significantly with respect to the position of the disk armature in the gap.

DESCRIPTION OF A PREFERRED EMBODIMENT

Figure 1:
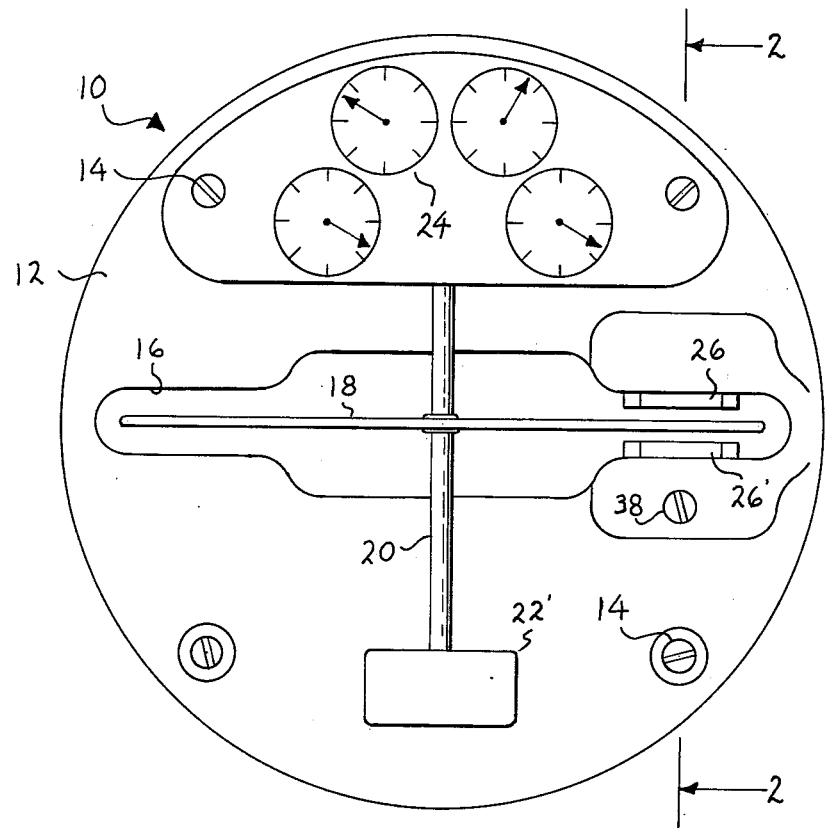
FIG. 1 is a front view of a portion of a conventional type of an alternating current induction watthour meter having installed therein the new magnetic damping device and system of this invention.

Referring to FIG. 1 of the drawing, 10 represents a portion of a conventional type of alternating current induction watthour meter such as is disclosed in U.S. Pat. Nos. 2,595,244; 2,668,275; and 2,683,921, cited above. The electromagnetic voltage and current coils, and other meter components such as the base and glass cover which are conventional are not shown.

A meter frame 12 is composed of a non-magnetic material such as die cast metal or organic plastic, and primarily consists of a supporting structure or framework for the mounting of certain operating components of the meter. Frame 12 is secured within the meter by suitable means such as bolts 14 which connect it to a meter base (not shown). A generally horizontal slot 16 or cut out is provided in frame 12 to accommodate the meter disk 18 which has a substantial section thereof extending through the slot 16 of the frame.

Figure 2:
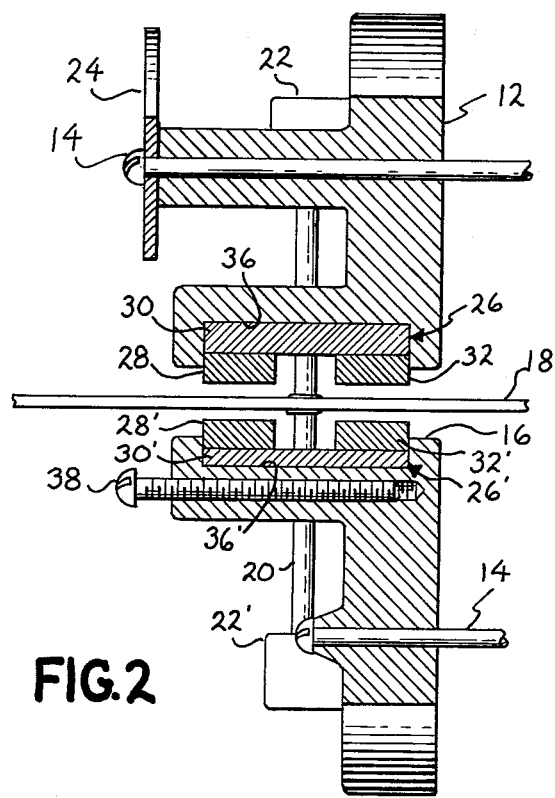
FIG. 2 is a side view of the portion of the meter of FIG. 1, with a part thereof in cross-section taken along line 2—2 of FIG. 1, and illustrating the new magnetic damping device and system of this invention; and, FIG. 3 is a perspective view of a pair of the magnetic unit assemblages which comprise the novel damping device and system of this invention.

Meter disk 18 comprises an electroconductive disk armature member which is suitably mounted for rotation on shaft 20. As shown in FIG. 2, upper and lower ends of shaft 20, or other apt portions thereof, are rotatably supported or mounted in appropriate bearing means 22 and 22', such as jewel bearings or a magnetic suspension system as disclosed in U.S. Pat. No. 2,311,382, or a combination of both.

The disk armature 18 is conventionally positioned substantially horizontal and supported on a substantially vertical shaft 20, as shown, to achieve optimum balance and minimum frictional or gravitational drag. The disk armature 18 is preferably mounted in front of the frame 12 of the meter 10 with a substantial segmental portion thereof extending back through the slot 16 opening in the frame, substantially as is illustrated, and the bearing mounts 22 and 22' carrying the disk's shaft 20 are connected with the front side of the frame.

The thus rotatably mounted electroconductive disk armature member 18 is conventionally driven by alternating flux fields produced by a system of alternating current electromagnets (not shown) associated with the disk armature and comprising voltage and current coils according to prior art alternating current induction watthour meter systems and/or devices shown in the art and the practice of the industry. As is well known, the power to be measured and which is therefore passed through the meter circuits, indirectly drives the disk armature 18, and its rate of rotation is dependent upon the power utilized. The revolutions of the disk armature are counted and indicated on the dials 24 of a register which is commonly gear driven from shaft 20. The register records and indicates the quantity of electrical energy consumed or utilized in accordance with prior art meter constructions.

Alternating current induction watthour meters of the conventional design described, normally include a magnetic damping or drag means or system providing a damping torque upon the flux induced rotation of the disk armature to retard and modulate the speed and any irregularities in the rate of its rotation, and restrain vibrations or abrupt motion therein.

This invention is specifically directed to and concerned with a new and improved magnetic damping system and device for alternating current induction watthour meters huch as described above and commonly used in the industry.

The unique damping system for the rotatable disk armature of this invention comprises a counterposed pair of predeterminedly spaced damping magnet units 26 and 26' with a unit positioned on each side of the disk armature and opposite each other whereby a portion of the disk armature can rotate within the gap or space intermediate the spaced magnet units.

The magnetic units 26 and 26' of this invention are approximate duplicates of each other, except for the opposite polarity of their respective magnets, and in the preferred construction, the thickness or mass of the flux carrying bridge piece, and the same numerals will be used to describe the same components of each unit in the following description.

Damping magnet units 26 each comprise a permanent or "hard" magnet 28 of relatively small size or mass. The permanent magnets 28 of this invention comprise magnetic materials principally composed of alloys of cobalt and rare earth metals such as samarium, for example $Co_5Sm$. Examples of cobalt-rare earth alloy magnets and materials therefor and their preparation which are suitable for use in this invention are given in U.S. Pat. Nos. 3,655,463, 3,826,696, 3,655,464, 3,856,580, 3,695,945, 3,856,581, 3,748,193. The contents and disclosures of the foregoing patents are incorporated herein by reference.

Each damping magnet unit 26 comprises an assemblage incorporating the permanent cobalt-rare earth magnet 28 into an integrated magnet unit or composite structure. The assemblage making up the magnet unit consists of a combination of the cobalt-rare earth permanent magnet with one or more components of low cost, magnetic flux conducting or "soft" magnetic materials such as iron or soft steel.

Figure 3:
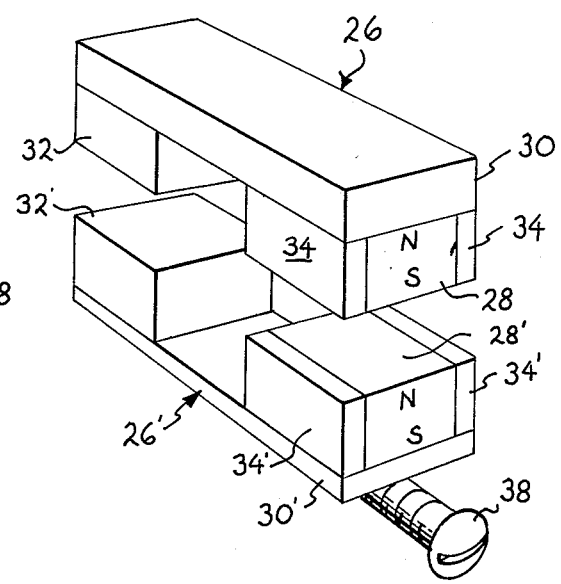

In the assemblages constituting the magnetic units, permanent magnets 28 are each affixed by suitable means, such as an adhesive, brazing or rivets, to a magnetic bridge member or bar 30 composed of soft steel or equivalent magnetic flux conducting metal. Magnetic bridge member 30 includes a projection or leg 32 which may be formed by an extended portion of the mass of the magnetic bridge member, or by a separate component such as illustrated in FIG. 3 which is affixed to the magnetic bridge member by suitable means including an adhesive, brazing or rivets. The permanent magnet 28 should be separated from the corresponding projection 32 on the same magnetic bridge member 30, such as illustrated with the magnet positioned near or at one end of the bridge member and the corresponding projection positioned near or at the end of the same bridge member opposite the magnet. The dimensions of the projection 32 are preferably approximately the same as that of the permanent magnet 28 and in a symmetrical arrangement therewith such as illustrated.

In the preferred embodiment of this invention, temperature compensating means are provided for the permanent magnets 28. Temperature compensating means for the assemblage forming the magnetic unit comprise magnetic shunts of relatively thin strips 34 or bands of metal having a negative temperature coefficient of permeability secured to the bodies of the permanent magnets 28. The temperature compensating shunts 34 extend substantially over at least two opposing sides or surfaces of the magnet and are affixed thereto by suitable means such as an adhesive, brazing or rivets. In the preferred embodiment, two stripes of the temperature compensating material adjoin the permanent magnet with one affixed to each edge of the magnet which extend perpendicular to a line passing from center of the disk armature through center of the magnet. However, these shunts can be provided encircling about or on four sides of the permanent magnets.

The temperature compensating shunts for this invention are composed of iron-nickel alloys having a magnetic permeability which decreases proportionally with temperature increases. Examples of such materials are given in U.S. Pat. Nos. 1,706,171 and 1,706,172.

The magnetic damping system and device for electromagnetic flux-driven disk armatures in alternating current induction watthour meters of this invention comprises a counterposed pair of magnet units of the described assemblage. The paired magnetic units 26 and 26' are predeterminedly spaced to provide a suitable intermediate gap or space therebetween for the projection and rotational movement therein of the disk armature 18. The paired magnet units 26 and 26' are assembled and matched with opposite poles of their respective magnets 28 and 28' facing each other, namely with a north pole immediately facing or adjacent to a south pole. Moreover, the paired and spaced magnet units 26 and 26' are aligned in a symmetrical relationship with the magnets 28 and 28' facing and opposing each other and the projections 32 and 32' of the magnetic bridge member facing and opposing each other in a separated, substantially conterminous arrangement such as illustrated in the drawing.

The assembled magnetic units 26 and 26', in the arrangement described above, are installed in appropriate cavities 36 and 36' or pockets formed within the frame 12, with one on either side of the horizontal slot 16. The magnetic units can be force fit into the cavities, or secured therein by a suitable adhesive or mechanical means.

According to a preferred embodiment of this invention, the magnetic bridge members 30 and 30' of each assemblage of a paired set of units 26 and 26', are of different sizes or mass, such as the different thicknesses illustrated in FIG. III, to cooperate with an adjustable magnetic flux shunt whereby the amount of magnetic flux traversing the air gap between the magnet units can be varied to provide versatility and precision in adjusting and balancing the magnet units. The bridge member 30' adjacent to the adjustable shunt, such as member 38, should be of substantially reduced mass, for example at least about ¾ to ¼ of the mass of the other bridge member 30, and preferably sized to operate at near saturation so that the adjustable shunt carries a portion of the flux field, with the amount being in proportion to its relative proximity to the adjacent bridge member.

The shunt adjustment comprises a piece of "soft", or magnetic flux conducting material such as soft steel located adjacent to at least one or both of the magnet units which is movable toward and away from the magnet unit, such as the vernier threaded, bolt-like member 38, whereby the shunting of the magnetic flux can be readily increased or decreased to adjust and balance the intensity of flux passing through the disk armature.

The described assembly and arrangement of the magnet units in the magnet damping system and device of this invention provides for a closed loop or circular flux field, which is highly symmetrical and uniform, cycling through the matched pair of magnet units and across the intermediate gap, and thereby twice traversing the interposed disk armature revolving therebetween and in opposite directions. The more symmetrical and uniform flow of magnetic flux reduces the sensitivities of the damping effect due to changes in the position of the disk armature or abrupt changes in its motion. Moreover, a two pole system such as embodied in this invention creates about 2.5 times the damping torque of a single pole system of the same values or magnitude of flux.

Although the invention has been described with reference to a specific embodiment thereof, numerous modifications are possible and it is desired to cover all modifications falling within the spirit and scope of this invention.

What I claim as new and desire to secure by Letters Patent of the United States is:

1. In an induction watthour meter including a rotatably mounted electroconductive disk armature driven by alternating flux fields produced by an alternating current electromagnet, a magnetic damping system for said disk armature comprising a counterposed pair of predeterminedly spaced damping magnet units with each unit positioned adjacent opposite sides of the disk armature and opposite the other, said magnet units each comprising an assemblage including a non-permanent magnet bridge member for conducting magnetic flux, a cobalt-rare earth permanent magnet affixed to the bridge member, and a non-permanent magnet projection member for conducting magnetic flux on said bridge member extending in spaced symmetrical relationship with and in the same direction as said magnet and being of approximately the same dimensions as the magnet, the unlike poles of said permanent magnets and said non-permanent magnet projection members for conducting magnetic flux each being aligned with its respective counterpart on the opposite side of the interposing disk armature whereby a closed loop magnetic flux field is established through the counterposed pair of damping magnet units and passes twice and in opposite directions through the interposed disk armature.

2. The magnetic damping system of claim 1, wherein the cobalt-rare earth magnets are cobalt-samarium magnets.

3. In an induction watthour meter including a rotatably mounted electroconductive disk armature driven by alternating flux fields produced by an alternating current electromagnet, a magnetic damping system for said disk armature comprising a counterposed pair of predeterminedly spaced damping magnet units with each unit positioned adjacent opposite sides of the disk armature and opposite the other, said magnet units each comprising an assemblage including a non-permanent magnet bridge member for conducting magnetic flux, a cobalt-rare earth permanent magnet affixed to the bridge member adjacent one of its ends, said magnet being provided with a temperature compensating shunt of a metal having a negative temperature coefficient of permeability adjoined thereto, and a non-permanent magnet projection member for conducting magnetic flux on said bridge member adjacent its end opposite the end having the permanent magnet affixed thereto and extending in spaced symmetrical relationship with and in the same direction as the magnet, the unlike poles of said permanent magnets and said non-permanent magnet projection members for conducting magnetic flux each being aligned with its respective counterpart on the opposite side of the interposing disk armature whereby a closed loop magnetic flux field is established through the counterposed pair of damping magnetic units and passes twice and in opposite directions through the interposed disk armature.

4. The magnetic damping system of claim 3, wherein the cobalt-rare earth magnets are cobalt-samarium magnets.

5. In an alternating current induction watthour meter including a frame, a rotatably mounted electroconductive disk armature driven by alternating flux fields produced by an alternating current electromagnet, a magnetic damping system for said disk armature comprising a counterposed pair of predeterminedly spaced damping magnet units mounted on the frame with each unit positioned adjacent opposite sides of the rotatable disk armature and opposite the other, said magnet units each comprising an assemblage including a non-permanent magnet bridge member for conducting magnetic flux, a cobalt-rare earth permanent magnet affixed to the bridge member adjacent one of its ends, and being provided with a temperature compensating shunt comprising a relatively thin body of magnetic material having a negative temperature coefficient of permeability adjoining at least two opposing sides of the permanent magnet, a non-permanent magnet projection member for conducting magnetic flux on said bridge member adjacent its end opposite the end having the permanent magnet affixed thereto and extending in spaced symmetrical relationship with and in the same direction as said magnet and being of approximately the same dimensions as the magnet and its temperature compensating shunts, the unlike like poles of said permanent magnets and said non-permanent magnet projection members for conducting magnetic flux each being aligned with its respective counterparts on the opposite side of the interposing disk armature whereby a closed loop magnetic flux field is established through the counterposed pair of damping magnet units and passes in opposite directions through the interposed disk armature.

6. The magnetic damping system of claim 5, wherein the cobalt-rare earth permanent magnets are cobalt-samarium magnets.

7. The magnetic damping system of claim 5, including an adjustable shunt adjacent to at least one of the magnet units.

8. The magnetic damping system of claim 5, wherein the temperature compensating shunts comprise an iron-nickel alloy.

9. In an induction watthour meter including a rotatably mounted electroconductive disk armature driven by alternating flux fields produced by an alternating current electromagnet, a magnetic damping system for said disk armature comprising a counterposed pair of predeterminedly spaced damping magnet units with each unit positioned adjacent opposite sides of the disk armature and opposite the other, said magnet units each comprising an assemblage including a non-permanent magnet bridge member for conducting magnetic flux, a cobalt-rare earth permanent magnet affixed to the bridge member, and a non-permanent magnet projection member for conducting magnetic flux on said bridge member extending in spaced symmetrical relationship with and in the same direction as said magnet and being of approximately the same dimensions as the magnet, the unlike poles of said permanent magnets and said non-permanent magnet projection members for conducting magnetic flux each being aligned with its respective counterpart on the opposite side of the interposing disk armature whereby a closed loop magnetic flux field is established through the counterposed pair of damping magnet units and passes in opposite directions through the interposed disk armature, and an adjustable magnetic shunt located adjacent one of said unit assemblage in close proximity to the magnetic bridge member thereof, said magnetic bridge member of the unit assemblage located adjacent to the adjustable magnetic shunt being of substantially reduced dimensions in relation to the magnetic bridge member of the other counterposed unit of the pair.

10. The magnetic damping system of claim 9, wherein the magnetic bridge member of the unit assemblage adjacent to the adjustable magnetic shunt is of a thickness of at least less than about three quarters of that of the magnetic bridge member of the other counterposed unit of the pair.

* * * * *